United States Patent
Xia et al.

(10) Patent No.: US 7,448,438 B2
(45) Date of Patent: Nov. 11, 2008

(54) HEAT PIPE TYPE HEAT DISSIPATION DEVICE

(75) Inventors: Wan-Lin Xia, Shenzhen (CN); Yong Zhong, Shenzhen (CN); Jun Long, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 12 days.

(21) Appl. No.: 11/309,622

(22) Filed: Sep. 1, 2006

(65) Prior Publication Data

US 2007/0295487 A1   Dec. 27, 2007

(30) Foreign Application Priority Data

Jun. 21, 2006   (CN) .................... 2006 1 0061242

(51) Int. Cl.
*F28D 15/00*   (2006.01)
*H05K 7/20*   (2006.01)
*F28F 7/00*   (2006.01)

(52) U.S. Cl. .................... 165/104.33; 165/104.21; 165/80.3; 165/185; 361/700

(58) Field of Classification Search ................ 165/80.3, 165/185, 104.21, 104.33, 104.34; 361/695, 361/697, 700, 704; 257/715; 174/15.2, 16.3
See application file for complete search history.

(56) References Cited

U.S. PATENT DOCUMENTS

| | | | |
|---|---|---|---|
| 5,699,853 A | 12/1997 | Goth et al. | |
| 6,382,306 B1 * | 5/2002 | Hsu | 165/80.3 |
| 6,796,373 B1 * | 9/2004 | Li | 165/104.21 |
| 6,938,682 B2 | 9/2005 | Chen et al. | |
| 7,021,368 B2 * | 4/2006 | Lin et al. | 165/104.33 |
| 7,051,792 B2 * | 5/2006 | Lee et al. | 165/104.21 |
| 2004/0226697 A1 * | 11/2004 | Liu | 165/104.33 |
| 2005/0092465 A1 * | 5/2005 | Lin et al. | 165/104.21 |
| 2005/0103476 A1 * | 5/2005 | Chen et al. | 165/104.33 |
| 2005/0141198 A1 * | 6/2005 | Lee et al. | 361/700 |

FOREIGN PATENT DOCUMENTS

TW   M248225   10/2004

* cited by examiner

*Primary Examiner*—Tho V Duong
(74) *Attorney, Agent, or Firm*—Frank R. Niranjan

(57) ABSTRACT

A heat pipe type heat dissipation device for an electronic component comprises a base plate, a cover plate spaced from the base plate, a plurality of parallel fins extending between the base plate and the cover plate and connecting with them. The base plate, the cover plate and each two adjacent fins collectively define a unitary air passage. The base plate has a protuberant portion, which has a convex surface facing towards the cover plate and has a thickness getting small from the middle to two sides in a direction parallel to the fins. The cover plate also has a protuberant portion similar to the protuberant portion of the base plate. A heat pipe connects the protuberant portions of the cover plate and the base plate.

10 Claims, 4 Drawing Sheets

HEAT PIPE TYPE HEAT DISSIPATION DEVICE

1. FIELD OF THE INVENTION

The present invention generally relates to heat dissipation devices, and more particularly to a heat pipe type heat dissipation device for cooling an electronic component, such as an integrated circuit package.

2. DESCRIPTION OF RELATED ART

Electronic components, such as central processing units (CPUs) include numerous circuits operating at high speed and generate substantial heat. Under most circumstances, it is necessary to cool the components in order to maintain safe operating conditions and assure that the components function properly and reliably. In the past, various approaches have been used to cool electronic components. A common approach is to mount a finned metal heat sink on top of the component. A conventional finned metal heat sink is made of highly heat-conductive metal, such as copper or aluminum, and generally includes a base for contacting the electronic component to absorb heat therefrom and a plurality of fins formed on the base for dissipating heat. However, as the operating speed of electronic components has increased markedly in recent years, such a conventional heat sink, which transfers heat solely by metal conduction, can no longer meet the heat dissipation requirements of highly heat-generating IC packages. Heat pipes, which operate by phase change of working liquid sealed in a hollow pipe, have been widely used due to their excellent heat transfer properties. Accordingly, heat dissipation devices equipped with heat pipes are devised in various manners and widely used.

U.S. Pat. No. 5,699,853 discloses a typical heat pipe type heat dissipation device. The heat dissipation device is provided with two spaced and parallel base plates, a plurality of fins sandwiched between the base plates and some heat pipes connecting the two base plates. During operation, one of the base plate is held in contact with an operating electronic component to absorb heat and transfer it to the fins, to the heat pipe, and then to the other base plate and the fins for dissipation. In this heat dissipation device, the base plate contacting the electronic device has its hot middle portion closer to electronic component than other portions thereof. The heat absorbed from the electronic component is first accumulated in the middle portion of the base plate, then spreads around the base, and is then conducted to the fins directly or by the heat pipes. It can be seen that facilitating heat transfer from this hot region of the base plate to others and decreasing heat density thereof as fast as possible is an important problem which needs addressing. If this hot area of the base plate can be cooled efficiently, the heat dissipation performance of the whole assembly will be enhanced; therefore, further optimization of the heat dissipation device is desirable.

Accordingly, what is needed is a heat pipe type heat dissipation device with an enhanced heat dissipation performance.

SUMMARY OF THE INVENTION

A heat pipe type heat dissipation device comprises a base plate, a cover plate spaced from the base plate, a plurality of parallel fins extending between the base plate and the cover plate and connecting with them, and at least a heat pipe connecting the cover plate and the base plate. The base plate has a protuberant portion, which has a convex surface facing towards the cover plate and has a thickness getting small from a middle to two sides of the protuberant portion in a direction parallel to that of the fins. The base plate, the cover plate and each pair of adjacent fins collectively define a unitary air passage. The heat pipe is connected to the protuberant portion of the base plate.

BRIEF DESCRIPTION OF THE DRAWINGS

Many aspects of the present heat pipe type heat dissipation device can be better understood with reference to the following drawings. The components in the drawings are not necessarily drawn to scale, the emphasis instead being placed upon clearly illustrating the principles of the present heat pipe type heat dissipation device. Moreover, in the drawings, like reference numerals designate corresponding parts throughout the several views. Other advantages and novel features will become more apparent from the following detailed description of preferred embodiment when taken in conjunction with the accompanying drawings, in which.

DETAILED DESCRIPTION OF THE INVENTION

Figure 1:
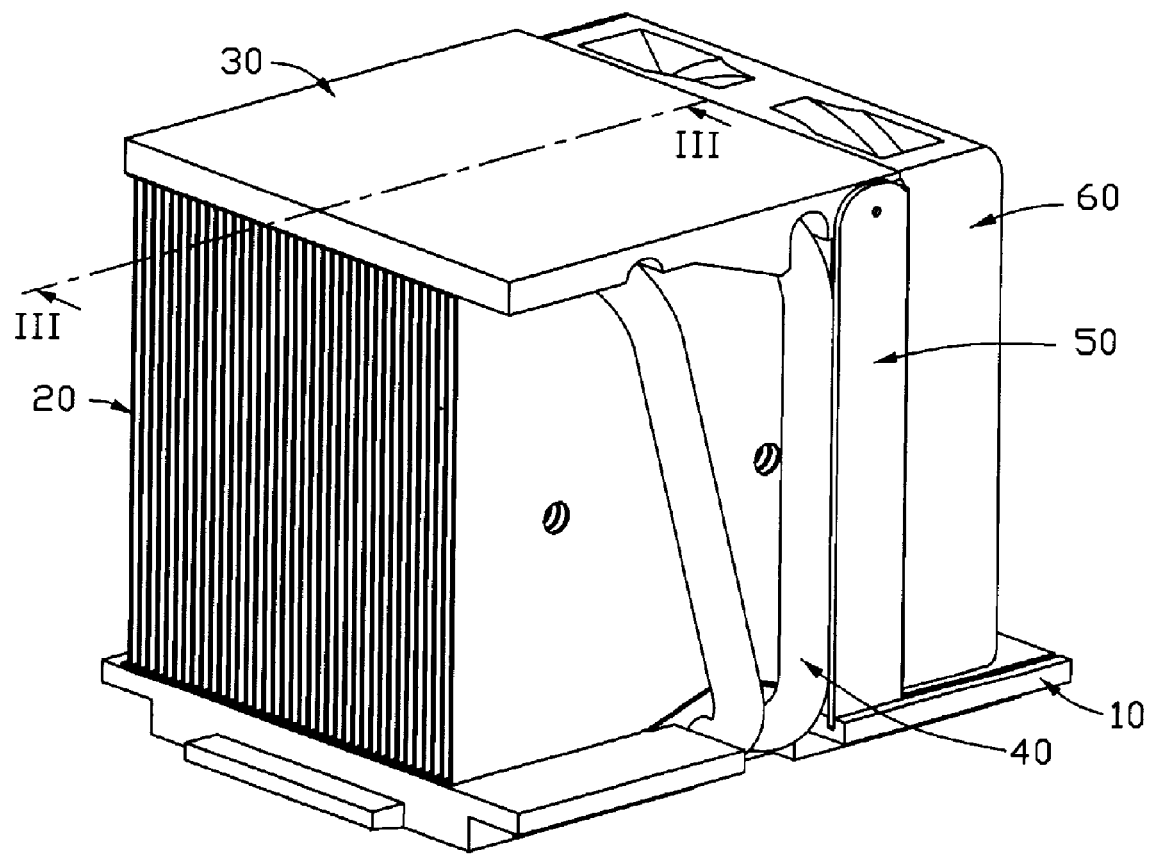
FIG. 1 is an isometric view of a heat pipe type heat dissipation device in accordance with a preferred embodiment of the present invention.

Referring to FIG. 1, a heat pipe type heat dissipation device in accordance with a preferred embodiment of the present invention is used for dissipating heat from an electronic component, such as an integrated circuit package (not shown). The heat dissipation device comprises a base plate 10, a cover plate 30 spaced from the base plate 10, two heat pipes 40 connecting the cover plate 30 and the base plate 10, and a plurality of parallel fins 20 extending between the base plate 10 and cover plate 30 and connecting with them.

The base plate 10 has a planar and smooth bottom face for contacting the electronic component and a top face opposite to the bottom face.

The cover plate 30 is separately located above and parallel to the base plate 10, having a planar and smooth top face and bottom face facing towards the base plate 10.

The fins 20 are arranged between the base plate 10 and the cover plate 30 and in connection with them. The fins 20 are arrayed parallel to each other, and substantially perpendicular to the base plate 10 and the cover plate 30. The fins 20, the base plate 10 and the cover plate 30 are connected together by soldering so as to define pluralities of unitary air passages. Each of the air passages extends in a direction parallel to the fins 20.

Figure 2:
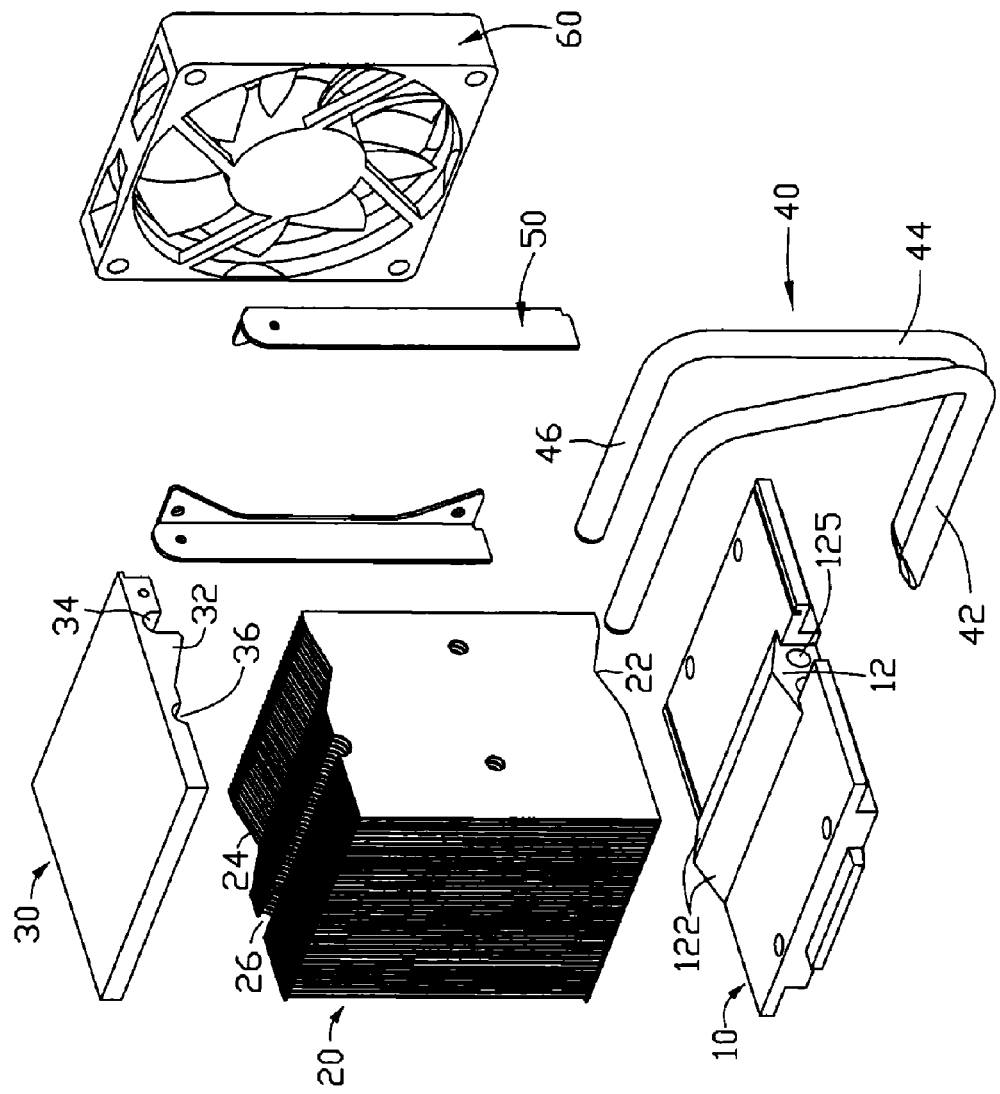
FIG. 2 is an exploded view of FIG. 1.

Referring to FIG. 2, the base plate 10 is processed to have a first protuberant portion 12 in the middle thereof, which has a convex top face facing towards the cover plate 30. The convex top face comprises two inclined planes 122 meeting at a peak where the base plate 10 has a maximum thickness. The first protuberant portion 12 is elongated from one edge of the base plate 10 to an opposing edge thereof, perpendicular to the fins 20 and the direction in which the air passages extend. Two spaced parallel passages 125 are defined in the base plate 10, extending along the first protuberant portion 12, under the convex top face of the first protuberant portion 12. The bottom face of the base plate 10 has a portion corresponding to the first protuberant portion 12 for contacting the electronic component.

Figure 3:
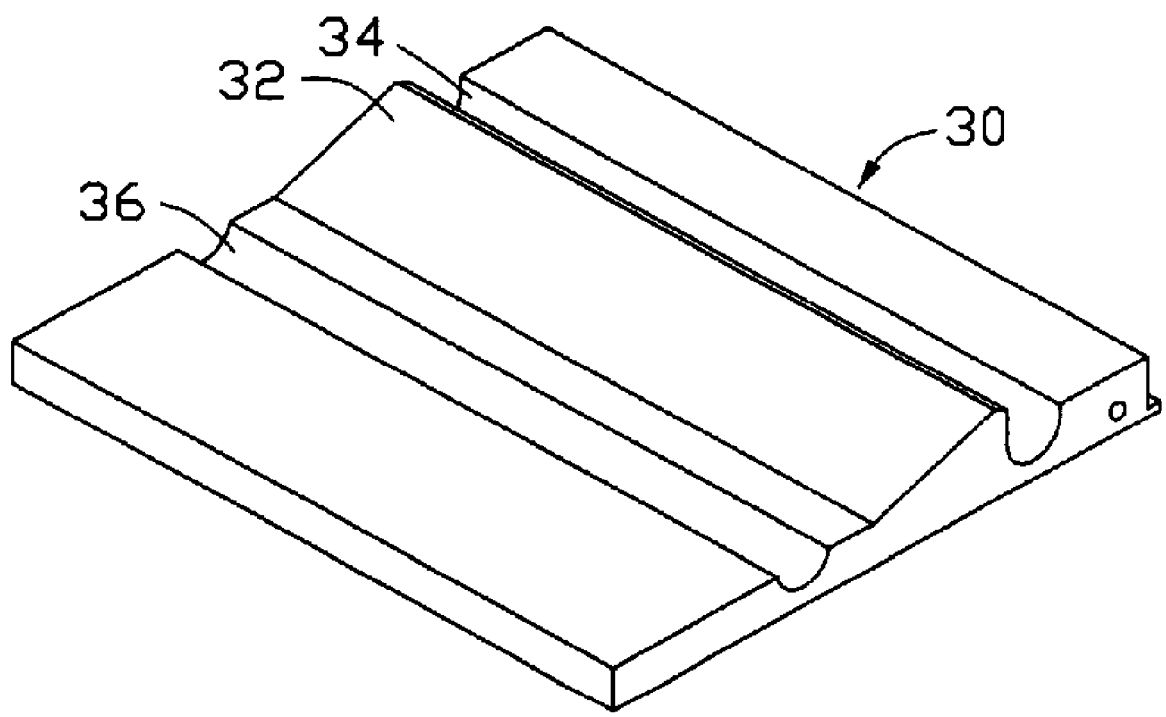
FIG. 3 is an inverted isometric view of a cover plate of the heat dissipation device of FIG. 1.
Figure 4:
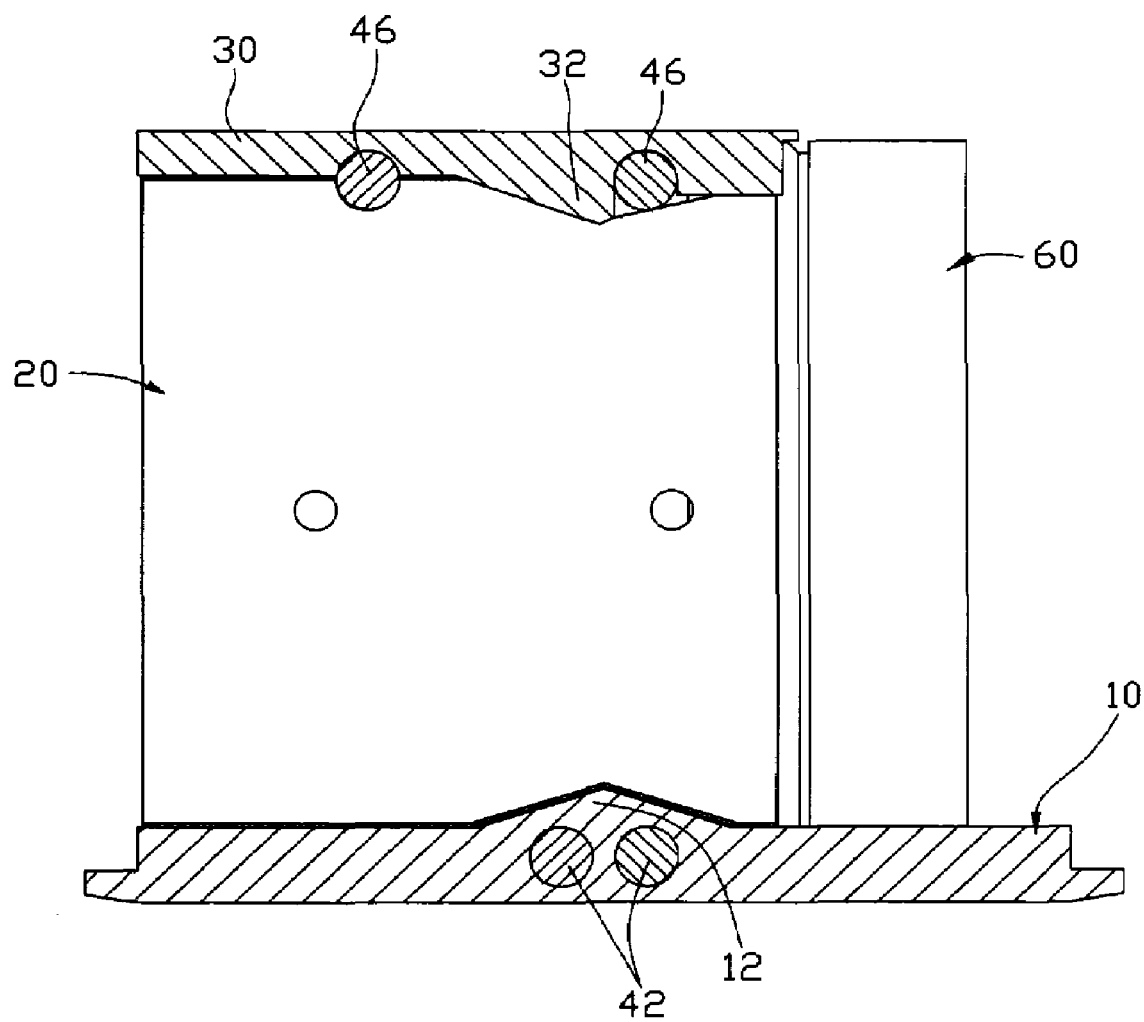
FIG. 4 is a cross-sectional view of FIG. 1, taken along line III-III of FIG. 1.

Referring to FIG. 3, the cover plate 30 is processed to have a second protuberant portion 32 in the middle thereof, which faces towards the base plate 10. The second protuberant portion 32 also has a convex bottom surface facing towards the base plate 10. The convex bottom surface comprises two inclined planes (not labeled) meeting at a peak where the cover plate 30 has a maximum thickness. The second protuberant portion 32 is elongated from one edge of the cover plate 30 to an opposing edge thereof. Two parallel grooves 34, 36 are defined in bottom face of the cover plate 30, one (i.e., the groove 34) extending along the second protuberant portion 32, and the other (i.e., the groove 36) located away from the second protuberant portion 32. Referring to FIG. 2, the fins 20 further define a groove 26 in a top edge thereof, corresponding to the groove 36, whereby when the fins 20 and the cover plate 30 are assembled together, a passage can be cooperatively formed by the grooves 26, 36 to receive a portion of a corresponding heat pipe 40. Referring to FIGS. 2 and 4, the space between the grooves 34 and 36 in the cover plate 30 is greater than that of the passages 125 of the base plate 10. The first protuberant portion 12 and the second protuberant portion 32 are substantially parallel to one another with peaks thereof aligned with each other in a plane which is perpendicular to fins 20 and perpendicular to the direction in which the air passages extend. Each fin 20 defines two notches 22, 24 on the top edge and the bottom edge thereof corresponding to the first and second protuberant portions 12 and 32.

Due to the protuberant portions 12, 32 of the base plate 10 and the cover plate 30, the space between opposing faces of the base plate 10 and the cover plate 30 varies from large to small, then to large. That is, the air passages are narrow in the middle, where the base plate 10 is hottest, and wide at two ends.

Referring to FIGS. 1 and 2, the heat pipes 40 are bent to have a U-shaped configuration. Each heat pipe 40 has an evaporating section 42 received in a corresponding passage 125 of the base plate 10, a condensing section 46 received in a corresponding groove 34 or 36 of the cover plate 30 and an adiabatic section 44 between the evaporating section 42 and a condensing section 46. The evaporating section 42 and the condensing section 46 extend in a direction perpendicular to the fins 20 and the air passages. Since the space between the grooves 34 and 36 of the cover plate 30 is larger than that between the passages 125 of the base plate 10, the condensing sections 46 of the two heat pipes 40 are more distant from each other than they are to the evaporating sections 42 thereof, thus enhancing heat absorption from the base plate 10 and heat distribution on the cover plate 30.

When the heat pipe type heat dissipation device is used with an electronic component, the base plate 10 contacts the electronic component to absorb heat therefrom. One part of the heat is transferred to the fins 20 directly, the other of the heat travels along the heat pipe 40 to the cover plate 30, then to the fins 20 for dissipation.

In above-described heat dissipation device, the protuberant portions 12, 32 of the base plate 10 and the cover plate 30 increase contacting surface area between the base plate 10, the cover plate 30 and the fins 20, which augments heat transfer from the highly hot region of the base plate 10 to the cover plate 30 and the fins 20, thereby enhancing heat dissipation efficiency of the heat dissipation device. The air passages are narrower in the position where the protuberant portions 12, 32 cross the fins 20 than in others, which leads to a higher velocity of airflow passing therethrough. The fast airflow velocity expedites direct heat dissipation from the hot region of the base plate 10. Consequently, the performance of the heat dissipation device as a whole is markedly improved. The heat dissipation device further comprises an electric fan 60 and a fan holder 50 mounting the fan 60 to the heat dissipation device. The fan 60 faces the air passages between the fins 20, whereby an airflow generated by the fan 60 can smoothly flow through the air passages.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat pipe type heat dissipation device comprising:
   a base plate;
   a cover plate spaced from the base plate;
   a plurality of parallel fins extending between the base plate and the cover plate and connecting with them so as to define a plurality of unitary air passages;
   a fan mounted on a side of the plurality of parallel fins; and
   at least a heat pipe connecting the cover plate and the base plate;
   wherein the base plate has a protuberant portion, which has a convex surface facing towards the cover plate and has a thickness getting small from a middle to two sides of the protuberant portion in a direction parallel to that of the fins, the base plate having a portion extending beyond the plurality of parallel fins, the fan being located on the portion of the base plate;
   wherein the cover plate has a protuberant portion which has a convex surface facing towards the base plate and parallel to the protuberant portion of the base plate;
   wherein the at least a heat pipe comprises an evaporating section connected to the protuberant portion of the base plate, a condensing section connected to the protuberant portion of the cover plate, and an adiabatic section connecting the evaporating section and the condensing section;
   wherein the at least a heat pipe comprises two heat pipes, the cover plate defines two separate and parallel grooves for receiving the condensing sections of the heat pipes, the base plate defines two separate and parallel passages for receiving the evaporating sections of the heat pipes, a space between the grooves of the cover plate is greater than that between the passages of the base plate; and
   wherein the two protuberant portions are formed in middle portions of the base plate and the cover plate in a direction of extension of the fins, one of the two grooves extending along the protuberant portion of the cover plate, another one of the two grooves being located away from the protuberant portion of the cover plate.

2. The heat dissipation device as described in claim 1, wherein the protuberant portion of the base plate is elongated in a direction perpendicular to the fins.

3. The heat dissipation device as described in claim 2, wherein each unitary air passage is defined by the base plate, the cover plate and each two adjacent fins, which is perpendicular to the elongated extending direction of the protuberant portion of the base plate.

4. The heat dissipation device as described in claim 1, wherein the convex face comprises two inclined planes meeting where the base plate has greatest thickness.

5. The heat dissipation device as described in claim 1, wherein each fin respectively defines notches corresponding to the protuberant portions of the base plate and cover plate.

6. The heat dissipation device as described in claim 1, wherein the base plate and the cover plate are parallel to each other.

7. A heat pipe type heat dissipation device comprising:
a base plate having a top face;
a cover plate spaced from the base plate and having a protuberant portion projecting from a bottom face thereof
a plurality of parallel fins extending between the top face of the base plate and the bottom face of the cover plate so as to define a plurality of air passages;
a fan mounted on a lateral side of the plurality of fins; and
two heat pipes each connecting the cover plate and the base plate, wherein a space between the top face and the bottom face is narrower in a middle portion of the air passage than two ends thereof, and wherein the base plate has a portion extending outside reach of the plurality of parallel fins, and the fan is located on the portion of the base plate;
wherein the base plate has a protuberant portion in the middle portion thereof in which evaporating sections of the two heat pipes are inserted; and
wherein one of the two heat pipes has the evaporating section thereof received in the protuberant portion of the base plate and a condensing section received in the cover plate and extending along the protuberant portion of the cover plate, and another one of the two heat pipes has the evaporating section thereof inserted into the protuberant portion of the base plate and a condensing section inserted into the cover plate and located away from the protuberant portion of the cover plate.

8. The heat dissipation device as described in claim 7, wherein the protuberant portions extend across the air passages.

9. The heat dissipation device as described in claim 8, wherein the protuberant portions extend perpendicular to the fins.

10. The heat dissipation device as described in claim 9, wherein the protuberant portions each have a convex surface, which comprises two inclined planes encountering where the base plate and the cover plate both have a maximum thickness.

* * * * *